United States Patent [19]

Lipson et al.

[11] 4,003,877
[45] Jan. 18, 1977

[54] PHOTOPOLYMERIZABLE SCREEN PRINTING INKS FOR PERMANENT COATINGS PREPARED FROM ARYLOXYALKYL COMPOSITIONS

[75] Inventors: Melvin A. Lipson, Fullerton; Dale W. Knoth, Norwalk; Walter D. Custer, Garden Grove; Michael N. Gilano, Fullerton, all of Calif.

[73] Assignee: Dynachem Corporation, Santa Ana, Calif.

[22] Filed: May 24, 1974

[21] Appl. No.: 473,180

[52] U.S. Cl. .......................... 260/47 UA; 260/49; 427/98; 427/375; 427/385 R; 526/303; 526/304; 526/306; 526/307; 526/320; 526/322; 526/328; 526/333

[51] Int. Cl.² ........................................ C09D 11/10

[58] Field of Search .............. 260/47 UA, 49, 47 C; 526/303, 304, 306, 307, 320, 322, 328, 333

[56] References Cited

UNITED STATES PATENTS

| | | | |
|---|---|---|---|
| 3,539,533 | 11/1970 | Lee et al. | 260/47 |
| 3,772,062 | 11/1973 | Shur et al. | 117/93.31 |

*Primary Examiner*—Lester L. Lee
*Attorney, Agent, or Firm*—Stanley A. Marcus

[57] ABSTRACT

Highly durable coatings are formed by the photopolymerization of screen printing inks containing aryloxyalkyl acrylate monomers or prepolymers, a polymerizable diluent and a free-radical initiating system, such inks having a viscosity of 5,000 to 200,000 centipoises and a thixotropic index of from 1 to 6. The photopolymerizable inks are useful for coating substrates, such as printed circuits, and serve as solder masks and resists for electroless plating, electroplating and etching.

9 Claims, No Drawings

PHOTOPOLYMERIZABLE SCREEN PRINTING INKS FOR PERMANENT COATINGS PREPARED FROM ARYLOXYALKYL COMPOSITIONS

This invention relates to a new and improved process for making protective coatings, such as solder mask coatings, its application to the preparation of printed circuits and the like, and improved photopolymerizable screen printing inks useful therefor. More specifically, the instant invention relates to liquid photopolymerizable compositions which may be readily applied by means of screen printing to a substrate and which are converted to dry, highly resistant coatings without the need to evaporate solvents and thermally cure.

In preparation of so-called printed circuits, it is necessary to coat the substrate with a tough, resistant coating for many applications. For example, coatings described as solder masks are generally used on quality printed circuit boards where molten solder is used to ensure good interconnections between the components and the circuitry. For these applications, the solder masks must be extremely resistant to heat, impervious to a wide range of solvents, strongly adherent to a wide variety of metallic and non-metallic substrates, and chemically resistant to the commonly used rosin-based fluxes. Since solder masks are usually left on the circuitry as a protective coating, they must also have long term durability and excellent electrical insulating properties.

Conventional solder mask coatings suffer from many disadvantages. Firstly, since they all contain significant amounts of solvents, drying of the freshly-printed coating consumes much time, requires significant heat energy, and generates solvent vapors which pollute the atmosphere. Additionally, the traditional solder mask coatings contain thermally-curable polymer systems such as epoxies or melamine-alkyds. These materials must be baked at temperatures of 120° to 175° C. for 30 to 60 minutes to effect the cure or cross-linking needed to give a resistant coating. Not only are energy and time consumed, but the baking process often liberates irritating and toxic fumes.

In the fabrication of printed circuits, there is also a great deal of interest in the so-called "additive process." In this process, a conductive circuit is built up from a bare plastic substrate by first using electroless plating to generate the conductive pattern. The resist coating on the substrate must endure electroless copper plating conditions, i.e., 30 minutes to 6 hours at pH 13 to 14 at temperatures of from 25° to 55° C. Very few coating materials are able to withstand such a treatment, and those coatings which do, generally require extensive baking periods prior to plating. Furthermore, since it is frequently desirable to leave such coatings on the printed circuit board, all-around durability and good electrical resistance are necessary.

In accordance with the invention, it has now been discovered that the aforesaid disadvantages can be overcome by using the screen printable photopolymerizable compositions of the invention, hereinafter referred to as "inks," in a process which also forms an embodiment of this invention.

Silk screen printing has been used commercially for over 60 years. Basically, the technique involves squeezing ink through the open meshes of a stretched piece of fabric, originally made of silk, onto a printable substrate. In order to form the pattern on the surface, the screen is imaged, i.e., covered or blocked out in part, by a masking material. The masking material may simply be a stencil or a dried lacquer, shellac or glue. Once the screen has been imaged, it is held taut on a frame and positioned over the substrate. Ink is poured onto the screen and squeezed through the open areas with a rubber-bladed squeegee. Thereafter, the frame is removed and the printed substrate dried.

Conventional screen printing inks are not useful in the practice of the invention. These contain from 40 to 50 percent of solvent, a wholly negative factor. On the one hand, during the printing process, the loss of solvent must be avoided because it leads to a drastic increase in viscosity and a clogging of the pores on the screen. On the other hand, once the ink is applied to the substrate, much energy and time are required for drying. Thus, the compounder is faced with the dilemma of seeking a solvent system which does not dry before application but which readily dries thereafter. Still other problems are caused by the presence of solvents, namely, odor, toxicity, flammability, explosivity, solubility, cost and availability. These problems are aggravated now by government regulations imposing severe limitations on the exhausting of solvents into the atmosphere. Additionally, because of the cost of the solvents, expensive recovery equipment is required.

Because of the aforesaid disadvantages of the presence of a solvent in inks generally, it has been proposed in U.S. Pat. Nos. 3,673,135 and 3,510,340 to Blake to use polymerizable compositions as printing inks. Such polymerizable materials are free of solvents and need only be cured to harden. Unfortunately, such compositions as described in the aforesaid patents have not found application as protective coatings useful for printed circuits and the like because such compositions are not useful for screen printing, nor are the coatings formed therefrom sufficiently durable. Furthermore, to polymerize the inks used by Blake, it is necessary to contact the printing ink with catalyst in a separate process step. Not only does this step complicate the process but, because the catalyst must be dissolved, solvent drying and recovery are necessary.

The process of the invention may be outlined as follows:

1. Screen printing on the surface of a substrate a liquid photopolymerizable ink, thereby leaving on the surface of said substrate an imaged photopolymerizable film at least 0.01 mm. thick.

2. Exposing the photopolymerizable film on said substrate to actinic radiation to form a resistant coating thereon.

3. Permanently modifying the adjacent areas on the substrate which are unprotected by the resist image by etching said areas or depositing material thereon.

4. Leaving the resist coating on the surface of the substrate as a durable protective coating or optionally stripping the resist from the surface of the substrate.

This method also overcomes the disadvantages of conventional photoresist technology. For example, in the practice of U.S. Pat. No. 3,469,982 to Celeste, the entire surface of the substrate is coated with photopolymerizable material. After exposure, the resist is developed by treating with a solvent to dissolve the unexposed portion. This is wasteful of the photopolymerizable composition and is particularly disadvantageous where the substrate must be treated prior to coating with the photopolymerizable material. In the case of electroless plating, for example, it is necessary to activate the substrate prior to coating with the photopolymerizable material because otherwise the resist, itself a polymer, would be activated to accept the electroless copper deposit. In the conventional process, activation may be adversely affected by the heat needed to laminate the photopolymerizable layer and by immersion in the developer solvent. In contrast, in performing the method of the instant invention, the photopolymerizable layer is applied only at selected portions of the substrate. No material is wasted. The screen printing operation takes place at room temperature and there is no contact whatever with those portions of the substrate to be treated. Secondly, because none of the photopolymerizable material remains uncured, no development is required. Hence, this second source of possible damage to the pretreated substrate is avoided.

Additionally, the conventional photoresists, whether liquid or dry-film, do not have the durability to perform as solder masks and cover coats.

The screen-printable photopolymerizable coatings of the invention comprise the following essential components:

A. A photopolymerizable material containing an aryloxyalkyl acrylate monomer or prepolymer (sometimes referred to herein as "epoxy-acrylates");

B. A liquid photopolymerizable diluent containing at least one terminal ethylenic group; and C. A free-radical generating addition-polymerizing initiating system activatable by actinic radiation.

A particular advantage of using the compositions of the invention in contrast to the volatile solvent-containing screen printed coatings of the prior art is that the coatings are 100 percent solids (non-volatiles) before curing. Finer mesh sizes, therefore, can be used to get heavy coatings, thereby increasing the resolution capability. Reliable work with lines and spaces below 10 mils is possible. Additionally, because the inks can be left on the screen indefinitely without any hardening or thickening, it is unnecessary to clean up the screens during short periods of inactivity. Also, time and energy are saved because curing of the material can be accomplished in exposure times of less than 5 seconds. Elimination of the drying time saves up to 90 percent of the electrical energy, since ultra-violet curing replaces the infra-red drying.

In the practice of the instant invention, the photopolymerizable compositions contain the following proportions of the essential components:

TABLE A

| Component | Broadly % by Wt. | Preferably % by Wt. |
|---|---|---|
| Aryloxyalkyl acrylate | 35–70 | 45–55 |
| Photopolymerizable diluent | 15–45 | 30–40 |
| Initiator | 0.1–10.0 | 0.5–5.0 |

The aryloxyalkyl acrylate monomers and prepolymers of the invention are the reaction products of epoxy compounds or omega-hydroxy ethers and unsaturated carboxylic acids. The carboxylic acids may be mono- or dicarboxylic acids containing from 3 to 18 carbon atoms. Alpha, beta-unsaturated carboxylic acids such as acrylic and methacrylic acids are preferred.

Monomers and prepolymers of the above type are commercially available under the tradenames of "Epocryl" (Shell Chemical Company), "Derakane" (Dow Chemical Company), "Nupol" (Freeman Chemical Company), and SR-348 and SR-349 (Sartomer Resins Company).

The use of aryloxyalkyl acrylate monomers and prepolymers in dry-film photoresists suitable for the manufacture of etched parts has been disclosed in U.S. Pat. No. 3,661,576 to Crary. Crary observed improvements in adhesion to various substrates using aryloxyalkyl acrylates, but he did not recognize the application of such materials to screen printing inks.

The aryloxyalkyl acrylates can be described as having the following general formula:

FORMULA A

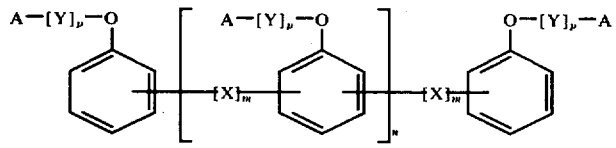

wherein X may be a methylene, an alkyl-substituted methylene group, a dialkyl-substituted methylene group, a carbonyl group, a sulfide, a sulfoxide, a sulfone, an amine, an alkyl-substituted amine, an ethylene ether, a propylene ether, a 2-hydroxypropylene ether, wherein each alkyl group may have from 1 to 8 carbon atoms, or any combination thereof; Y may be ethyl, propyl, 2-hydroxypropyl, or other lower alkyl or hydroxyalkyl groups having up to 8 carbon atoms; A may be an unsaturated acyloxy group having from 3 to 18 carbons, preferably acryloxy or methacryloxy; and $n$ may be 0 through 20, $m$ may be 0 or 1, and $p$ may be 0 or 1.

In addition, the aromatic rings shown in the formula may be ring-substituted with 1 to 4 additional substituents such as chlorine or bromine.

The photopolymerizable diluents of the invention are ethylenically unsaturated compounds which contain at least one terminal ethylenic group. It is most preferable that at least two or more terminal ethylenic groups be present. The diluent must have a boiling point of at least 100° C. at atmospheric pressure and be capable of forming a high polymer by free-radical photo-initiated chain-propagating addition-polymerization. These materials include unsaturated esters of polyols, particularly such esters of the methylene carboxylic acids, e.g., ethylene diacrylate; diethylene glycol diacrylate; glycerol diacrylate; glycerol triacrylate; ethylene dimethacrylate; 1,3-propylene dimethacrylate; 1,2,4-butanetriol trimethacrylate; 1,4-benzenediol dimethacrylate; pentaerythritol tetramethacrylate; 1,3-propanediol diacrylate; 1,6-hexanediol diacrylate; the bis-acrylates and methacrylates of polyethylene glycols of molecular weight 200–500; trimethylolpropane triacrylate; pentaerythritol triacrylate; unsaturated amides, particularly those of the methylene carboxylic acids, and especially those of alpha,omega-diamines and oxygen-interrupted omega-diamines, such as methylene bis-acrylamide; methylene bis-methacrylamide; 1,6-hexamethylene bis-acrylamide; diethylene triamine tris-methacrylamide; bis-(methacrylamidopropoxy) ethane; bis-methacrylamidoethyl methacrylate N-[(beta-hydroxyethyloxy) ethyl] acrylamide; vinyl esters such as divinyl succinate, divinyl adipate, divinyl phthalate, divinyl terephthalate, divinyl benzene-1,3-disulfonate, and divinyl butane-1,4-disulfonate; and unsaturated aldehydes such as sorbaldehyde (hexadienal).

Monofunctional monomers may also be used as polymerizable diluents, but these are generally less satisfactory because of greater volatility and because they tend to form less durable polymers. These materials include hydroxyalkyl acrylates and methacrylates, dibromopropyl acrylate and methacrylate, and the half-esters of hydroxyalkyl acrylates and methacrylates with such dicarboxylic acids as maleic, adipic, and phthalic acid.

The photo-initiators used in the compositions are preferably those activatable by actinic light and thermally inactive at 185° C. and below. The amount used in the composition varies widely depending on the initiator selected. The optimum amount, however, can be readily determined by simple experimentation. The most preferred initiators are the acyloin ethers such as the benzoin ethers, particularly benzoin isobutyl ether, alkyl-substituted antraquinones such as 2-tert-butylanthraquinone, and α, α-diethoxyacetophenone. Other initiators which may be used include the substituted or unsubstituted polynuclear quinones, such as 9,10-anthraquinone; 1-chloroanthraquinone; 2-chloroanthraquinone, 2-methylanthraquinone; 2-ethylantraquinone; octamethylanthraquinone; 1,4-naphthoquinone; 9,10-phenanthraquinone; 1,2-benzanthraquinone; 2,3-benzanthraquinone; 2-methyl-1,4-naphthoquinone; 2,3-dichloronaphthoquinone; 1,4-dimethylanthraquinone; 2,3-dimethylanthraquinone; 2-phenylanthraquinone, 2,3-diphenylanthraquinone; sodium salt of anthraquinone alpha-sulfonic acid; 3-chloro-2-methylanthraquinone; retenequinone; 7,8,9,10-tetrahydronaphthacenequinone; 1,2,3,4-tetrahydrobenz(a)anthracene-7,12-dione.

The following photoinitiators, described in U.S. Pat. No. 2,760,863, some of which may be thermally active at temperatures as low as 85° C., are also useful: vicinal ketaldonyl compounds, such as diacetyl and benzil; alpha-ketaldonyl alcohols, such as benzoin and pivaloin; alpha-hydrocarbon-substituted aromatic acyloins; alpha-methylbenzoin; alpha-allylbenzoin; and alpha-phenylbenzoin.

Silver persulfate is also useful as a free-radical generating initiator activatable by actinic radiation. Certain aromatic ketones, e.g., benzophenone and 4,4'-bis-dialkylaminobenzophenones, are also useful.

In addition to the three components of the polymerizable composition of the invention set forth above, additional materials are added in order to obtain the necessary properties for a screen ink and the resulting polymers. They are named in Table B below.

In the practice of the instant invention, the photopolymerizable compositions may contain, in addition to those set forth in Table A, the following proportions of the several components:

TABLE B

| Component | Broadly % by Wt. | Preferably % by Wt. |
| --- | --- | --- |
| Inhibitor | 0.01–1.0 | 0.02–0.1 |
| Filler | 10–30 | 15–25 |
| Thixotropic Agent | 0.1–2.0 | 0.5–1.5 |
| Leveling Agent | 0.5–2.5 | 0.75–1.25 |
| Adhesion Promoter | 0.1–0.5 | 0.15–0.3 |
| Pigment | 0.1–2.0 | 0.5–1.5 |
| Plasticizer | 1.0–5.0 | 2.0–4.0 |

The selection of the materials and the amounts employed may be readily determined by those skilled in the art.

The materials of the invention are resistant to high temperatures, remain flexible after exposure to high temperature, have good dielectric properties, viz., an insulation resistance of $1 \times 10^{11}$ ohms or higher, low permeability to both air and moisture, and adhere to a broad cross-section of materials such as various metals and plastic compositions. The high temperature resistance makes the coating particularly useful for reflowing low melting (225°–350° C.) metals for leveling and for alloying bimetals such as deposited in tin-lead electroplating.

The solvent resistance of the coatings of the invention is outstanding. For example, they are able to withstand immersion in 3 percent potassium hydroxide or methylene chloride for 4 hours at room temperature. Furthermore, high temperature immersion at 55° C. in 3 percent potassium hydroxide for over 1 hour results in no degradation. The coating can be removed only by the most potent solvent blends such as those used for stripping baked epoxides.

Thermal polymerization inhibitors are generally also present in the preferred compositions. These materials act as antioxidants and stabilizers and include p-methoxyphenol, hydroquinone and alkyl and aryl-substituted hydroquinones and quinones, tert-butyl catechol, pyrogallol, copper resinate, napthylamines, beta-naphthol, cuprous chloride, 2,6-di-tert-butyl p-cresol, 2,2-methylenebis-(4-ethyl-6-t-butylphenol), phenothiazine, pyridine, nitrobenzene, dinitrobenzene, p-toluquinone, chloranil, aryl phosphites, and aryl alkyl phosphites.

In order to obtain a useful screen printing coating, it is essential that the composition of the invention have the appropriate viscosity and thixotropic properties. While usable compositions may be obtained by the selection of the epoxy-acrylates and the photopolymerizable diluents in the relative amounts thereof employed, it is generally desirable to add thixotropic agents, leveling agents and defoamers to achieve a viscosity of from 5,000 to 200,000 centipoises and a thixotropic index of from 1.00 to 6.00.

The thixotropic agents which may be used are well known to those skilled in the art. Examples of these materials are Bentone (a trademark of National Lead Company for an organic base salt of a clay mineral, e.g., montmorillonite) and other silicate-type materials. Other thixotropic agents are the aluminum, calcium, and zinc salts of fatty acids, such as lauric or stearic acid, e.g., Zinc Soap No. 26 (trademark of the Witco Chemical Co., Inc.); and fumed silicas such as Cab-o-Sil and Santocel (trademarks of the Cabot Corporation and Monsanto Corporation, respectively).

The leveling agents and defoamers which may be used include Modaflow and Multiflow. These are trademarks of the Monsanto Company for resin modifiers. Other leveling and flowout agents include aluminum stearate, calcium stearate, sucrose benzoate, and high molecular weight nonionic surface active agents.

Other ingredients may also be added to the coatings of the invention. These include plasticizers, pigments or colorants, fillers, and adhesion promoters. Those skilled in the art may readily determine the amount of such materials desirable.

Commonly used fillers are barium sulfate, talc, calcium carbonate, zinc oxide and silicas and silicates. Suitable plasticizers, used to increase the flexibility of the film, include the polyfunctional esters such as dioctyl phthalate, tricresyl phosphate, polyethyleneglycol diacetate, and pentaerythritol tetramercaptopropionate.

In practicing the process of the invention, any of the well known screen printing techniques may be employed. The photopolymerizable ink is applied by pouring a measured quantity on the screen. The squeegee is drawn uniformly and with even pressure to scrape the ink across the entire surface of the screen, thereby transferring the ink to the substrate below. Thereafter, the screen is lifted and the substrate removed. Film thicknesses ranging from 0.006 mm. to 0.130 mm. are applied by this procedure. Film thickness can be measured by such means as micrometer or beta-ray backscattering.

After the print is completed, the screen is lifted and the wet substrate removed and passed to the ultraviolet radiation source. Such sources include carbon arcs, mercury vapor lamps, fluorescent lamps with ultraviolet radiation-emitting phosphors, argon glow lamps, electronic flash units and photographic flood lamps. Of these, the medium pressure mercury vapor lamps are the most suitable. The period of exposure, as will be readily understood by those skilled in the art, will be dependent on the film thickness, the light intensity, the distance from the light source to the ink and the temperature of the operation. A typical exposure time using a 200 watt per linear inch medium pressure mercury vapor lamp at a distance of 4 inches is about 5 seconds. After the exposure, the ink is completely cured and may be passed directly to the next processing step to modify the unexposed portion of the substrate.

The photopolymerizable compositions of the invention make possible processing sequences not heretofore feasible. For example, in the photoresist used by Celeste, if such were to be applied to construct an additive circuit on a circuit board, the sequence would be: (1) activate the substrate; (2) form the electroless copper deposit; (3) apply the photopolymerizable film over the electroless copper layer; (4) expose the film through a negative; (5) develop by washing away the unpolymerized areas; (6) electroplate the exposed areas; (7) strip the resist; and (8) dissolve the uncoated electroless copper. Contrast this to the improved process of the instant invention. The substrate, as for example an epoxy-fiberglass board, is first activated; the photopolymerizable ink is applied imagewise via a screen printing process; the wet ink is instantly cured without the need for developing; and thereafter the electroless copper layer is deposited, followed by the electroplating. Thi sequence of steps eliminates the development step, the stripping of the resist, and the need to dissolve the extraneous electroless copper. It is necessary to dissolve the electroless copper coating in the process of the prior art, since obviously this conductive surface would destroy the usability of the printed circuit board. From the material standpoint, no more photopolymer is required than that needed to form the resist and no more electroless copper employed than needed to coat the area intended to be plated.

Not only are materials saved and process steps eliminated, but a higher quality product can be obtained. In the process of the prior art, the need to strip the resist resulted in a treatment step which affected the substrate. Also, it was necessary to adhere the photopolymerizable film to the electroless copper coated surface rather than directly to the substrate. This additional layer between the substrate and the photoresist increases the adhesion problems during manufacture.

In order to more fully describe the instant invention, attention is directed to the following examples:

EXAMPLE I

A photopolymerizable screen-printable ink composition useful for solder mask applications is prepared having the following composition:

TABLE I

| Component | Percent by Weight |
| --- | --- |
| Epoxy-acrylate (Epocryl 12*) | 40.21 |
| Trimethylolpropane triacrylate | 37.66 |
| 2-t-Butylanthraquinone | 0.48 |
| Filler (Barium sulfate) | 16.10 |
| Paliofast Green 9360 (BASF) | 1.97 |
| Modaflow (A resinous modifier made by Monsanto Co.) | 0.97 |
| Pentaerythritol tetramercaptopropionate | 2.40 |

*A trademark of Shell Chemical Company for an epoxy prepolymer having the formula:

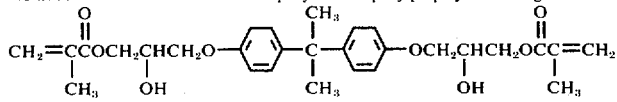

The resulting composition has a viscosity of 8,000 cps and a thixotropic index of 1.00.

A copper-clad epoxy-fiberglass printed circuit board having an etched conductive pattern is used as the test panel. The panel is placed under a silk screen frame having a patterned screen tautly stretched within. A measured amount on the photopolymerizable composition is poured onto the screen, and the composition is screen-printed onto the test panel uniformly with a squeegee using methods well known to those skilled in the art. Observation of the application shows that the polymerizable composition covers the surface uniformly, even though the panel surface is not planar, forming a layer about 1 mil in thickness. After the application of the photopolymerizable layer, the screen is removed from the substrate. There is no mesh marks on the printed substrate and the design on the screen is reproduced with excellent integrity. The substrate containing the wet photopolymerizable coating is exposed for 5 seconds to a 200 watt per linear inch medium pressure mercury vapor lamp at a distance of 4 inches. After the exposure, the printed coating is completely hardened to form a solder mask resist. The cured coating is a tough thermoset-like material which cannot be manually scratched or chipped. The cured coating has an insulation resistance of $1.2 \times 10^{12}$ ohms as determined by MIL-I-46058C, a value which is considered to be excellent by known standards.

The panel is then subjected to wave-soldering at 260° C. The technique of wave-soldering is well known to those in the art, being performed on a machine such as the Gale AA-11 manufactured by Excellon Industries. The panel passes through the machine on a conveyor and is treated in three steps: (1) foam fluxing, to prepare the exposed copper for good solder adhesion; (2) preheating to drive off the flux solvents, activate the flux and reduce the thermal shock of the board contacting molten solder; and (3) wave soldering, where the inverted board is passed over a 3 inch wide wave of molten solder at a conveyor speed of 18 inches per minute, to deposit a uniform layer of solder upon the exposed copper surfaces and in all through-hole connections.

The panel is then cooled with air or water spray and treated with a flux-removing solvent such as methylene chloride, and dried. Examination of the panel shows that the coating has completely protected the covered areas from solder. The coating remains hard and durable, thus giving the covered areas a permanent protection for the life of the circuit board.

EXAMPLE II

A photopolymerizable screen-printable ink composition useful for solder mask and additive circuitry applications is prepared having the following composition:

TABLE II

| Component | Percent by Weight |
| --- | --- |
| Epoxy-acrylate (Epocryl 12) | 39.66 |
| Trimethylolpropane triacrylate | 37.07 |
| 2-t-Butylanthraquinone | 0.47 |
| Barium sulfate | 15.80 |
| Paliofast Green 9360 | 2.02 |
| Modaflow | 0.96 |
| Bentone 38 | 1.46 |
| Pentaerythritol tetramercaptopropionate | 2.35 |

An epoxy-fiberglass composite board is palladium-activated with a solution described in U.S. Pat. No. 3,011,920 to Shipley. The sensitized board is screen printed with the above formulation as described in Example I. The ink has a viscosity of 100,000 cenipoises and a thixotropic index of 3.31. The photopolymerizable composition covers the surface uniformly and no mesh marks appear on the substrate. The design on the screen is reproduced with excellent integrity. The wet photopolymerizable ink is cured by exposure as described in Example I. After exposure, the printing coating is completely hardened. The board thus prepared is treated sequentially with the electroless copper plating bath, the copper sulfate electroplating bath and the tin-lead fluoborate electroplating bath. The three treating steps may be described as follows:

Electroless copper plating bath: This bath contains 9.25 grams per liter of copper sulfate, 16 grams per liter of sodium hydroxide, 5 grams per liter of sodium carbonate, 30 grams per liter of 37 percent formaldehyde and 33 grams per liter of a chelating agent. It has a pH of 13.3. The board is subjected to immersion in this bath for 10 minutes at 25° C. The use of this bath is further described in U.S. Pat. No. 3,790,392 to Gilano.

Copper sulfate electroplating bath: This bath contains 120 grams per liter of copper sulfate, 215 grams per liter of sulfuric acid, and 40 grams per liter of brightener and has a pH of 0.2. The board is subjected to immersion in this bath for 30 minutes at 25° C. with an applied current of 30 amperes per square foot.

Tin-lead (60/40) fluoborate electroplating bath: This bath contains 52 grams per liter of stannous ion, 30 grams per liter of lead ion, 100 grams per liter of fluoboric acid, 25 grams per liter of boric acid and 5 grams per liter of peptone. The pH is 0.2. The board is subjected to immersion in this bath for 15 minutes at 25° C. with an applied current of 15 amperes per square foot.

After the substrate is removed from the final bath, the resist is carefully inspected. Inspection shows that the resist is intact, and still substantially similar in appearance to the resist prior to the treating operations. The resist has an insulation resistance of $1.2 \times 10^{12}$ ohms.

The cured formulation of this example can be wave soldered, as described in Example I, without detriment.

EXAMPLE III

A photopolymerizable screen-printable ink composition useful for solder mask and additive circuitry applications is prepared having the following compositon:

TABLE III

| Component | Percent by Weight |
| --- | --- |
| Bis-2,2-[4-(beta-hydroxyethyl)-phenyl]-propane diacrylate | 57.13 |
| Tetraethyleneglycol diacrylate | 16.32 |
| Epon 1007* | 24.49 |
| 2-t-Butylanthraquinone | 0.59 |
| Paliofast Green 9360 | 1.97 |
| Modaflow | 0.98 |

*A trademark of Shell Chemical Company for an epoxy resin having an epoxy equivalent of 2000–2500.

The following description shows the application of solder reflow technique to the materials of the invention:

A copper-clad epoxy-fiberglass printed circuit board is coated with photoresist, exposed through a photographic negative and developed according to the procedure described in the Celeste patent. The unprotected copper surface is then pattern-plated successively in the copper sulfate electroplating bath and a tin-lead fluoborate electroplating bath, described in Example II. Deposits of approximately 1 mil each of electroplated copper and tin-lead are built up over the exposed sections of copper foil. The photoresist is stripped, and the panel is subjected to a spray of Alkaline Etchant A system (manufactured by Southern California Chemical Company) for 3 to 5 minutes at 55° C. (cf. U.S. Pat. No. 3,705,061 to King). The electroplated tin-lead layer acts as an etch resist, and the unprotected copper foil is dissolved. Following this etching process, there remains a circuit pattern composed of three layers, i.e., copper foil, electroplated copper, and electroplated tin-lead.

The panel is then subjected to a process called "solder reflow." In this process, the electroplated tin-lead bimetallic deposit is fused to form the solder alloy. This improved the conductivity, physical properties and corrosion-resistance of the tin-lead deposit. To selectively mask and protect the panel, the composition of Table III is applied and cured as described in Example I. The ink has a viscosity of 6500 centipoises and a thixotropic index of 1.30. The panel is then immersed in heated oil at a temperature of 245° to 275° C. for 10 to 20 seconds. During this brief period the reflow process takes place and the alloy forms. The panel is cooled, cleaned with chlorinated solvent to remove the oil, and dried. Examination of the panel shows that the cured coating is intact. The coating remains on the panel as permanent protection for the life of the circuit board. This coating has an insulation resistance of $1.8 \times 10^{12}$ ohms.

The cured formulation of this example can be wave soldered, as described in Example I, without detriment.

EXAMPLE IV

A photopolymerizable screen-printing ink composition useful for solder mask and additive circuitry applications is prepared having the following composition:

TABLE IV

| Component | Percent by Weight |
| --- | --- |
| Epoxy-acrylate (Epocryl DRH-303*) | 47.24 |
| Trimethylolpropane triacrylate | 28.34 |
| 2-t-Butylanthraquinone | 0.57 |
| Barium sulfate | 18.90 |
| Phthallo Green Pigment | 0.94 |
| Modaflow | 0.94 |
| Pentaerythritol tetramercaptopropionate | 2.83 |
| Benzotriazole | 0.24 |

*A trademark of Shell Chemical Company for an epoxy prepolymer having the formula:

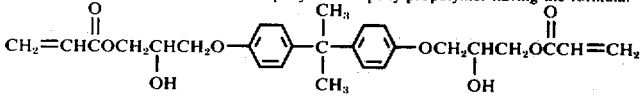

This ink has viscosity of 35,000 cps and a thixotropic index of 1.52. The resist has an insulation resistance of $1.8 \times 10^{12}$ ohms and performs satisfactorily in the applications shown in Examples I and II.

We claim:

1. A photopolymerizable screen-printing ink which comprises:

A. 35–70% by weight of an aryloxyalkyl acrylate having the general formula:

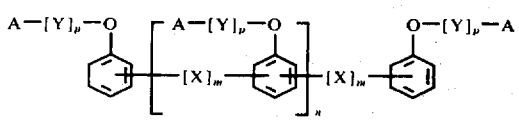

wherein

X is a methylene, an alkyl-substituted methylene group, a dialkyl-substituted methylene group, a carbonyl group, a sulfide, a sulfoxide, a sulfone, an amine, an alkyl-substituted amine, an ethylene ether, a propylene ether, a 2-hydroxylpropylene ether, wherein each alkyl group contains from 1 to 8 carbon atoms;

Y is lower aklyl or hydroxylower alkyl of up to 8 carbon atoms;

A is an unsaturated acyloxy group having from 3 to 18 carbon atoms; and n is 0 through 20, m is 0 or 1, p is 0 or 1;

B. 15–45% by weight of a photopolymerizable diluent having terminal ethylenic groups selected from ethylene diacrylate; diethylene glycol diacrylate; tetraethylene glycol diacrylate; glycerol diacrylate; glycerol triacrylate; ethylene dimethacrylate; 1,3-propylene dimethacrylate; 1,2,4-butanetriol trimethacrylate; 1,4-benzenediol dimethacrylate; pentaerythritol tetremethacrylate; 1,3-propanediol diacrylate; 1,6-hexanediol diacrylate; the bis-acrylate of a polyethylene glycol having a molecular weight of 200 to 500; the bis-methacrylate of a polyethylene glycol having a molecular weight of 200 to 500; trimethylolpropane triacrylate; pentaerythritol triacrylate; methylene bis-acrylamide; methylene bis-methacrylamide; 1,6-hexamethylene bis-acrylamide; diethylene triamine tri-methacrylamide; bis-(methacrylamidopropoxy) ethane; bis-methacrylamidoethyl methacrylate N-(beta-hydroxyethyloxy) ethyl acrylamide; divinyl succinate; divinyl adipate; divinyl phthalate; divinyl terephthalate; divinyl benzene-1,3-disulfonate; divinyl butane-1,4-disulfonate; and sorbaldehyde;

C. 0.1–10% by weight of a free radical generating addition polymerizing initiating system;

said photopolymerizable composition having a viscosity of from 5,000 to 200,000 centipoises and a thixotropic index of from 1.00 to 6.00.

2. The composition of claim 1 wherein the aryloxyalkyl acrylate is bis-2,2-[4-(beta-hydroxyethyl)-phenyl]-propane diacrylate or dimethacrylate.

3. The composition of claim 1 wherein the aryloxyalkyl acrylate is the reaction product of acrylic acid or methacrylic acid and the diglycidyl ether of 2,2-(4-hydroxyphenyl)-propane.

4. The composition of claim 1 wherein the photopolymerizable diluent contains two or more terminal ethylenic groups.

5. The composition of claim 1 wherein the photopolymerizable diluent is tetraethylene glycol diacrylate.

6. The composition of claim 1 wherein the photopolymerizable diluent is trimethylolpropane triacrylate.

7. The composition of claim 1 wherein the initiating system contains a benzoin ether.

8. The composition of claim 1 wherein the initiating system contains an alkyl-substituted anthraquinone.

9. The composition of claim 1 wherein the initiating system contains an α,α-dialkoxy-substituted acetophenone.

* * * * *